United States Patent [19]

Mathew et al.

[11] Patent Number: 5,328,079
[45] Date of Patent: Jul. 12, 1994

[54] METHOD OF AND ARRANGEMENT FOR BOND WIRE CONNECTING TOGETHER CERTAIN INTEGRATED CIRCUIT COMPONENTS

[75] Inventors: Ranjan J. Mathew; Arnold Smith; Luu T. Nguyen, all of San Jose, Calif.

[73] Assignee: National Semiconductor Corporation, Santa Clara, Calif.

[21] Appl. No.: 34,683

[22] Filed: Mar. 19, 1993

[51] Int. Cl.$^5$ ...................... H01R 43/02; H01L 21/60
[52] U.S. Cl. ............................................... 228/180.5
[58] Field of Search ...................... 228/179, 4.5, 180.5

[56] References Cited

U.S. PATENT DOCUMENTS

| | | | |
|---|---|---|---|
| 4,068,371 | 1/1978 | Miller | 228/179 X |
| 4,858,819 | 8/1989 | Hill et al. | 228/179 |
| 4,875,618 | 10/1989 | Hasegawa et al. | 228/179 |
| 5,014,111 | 5/1991 | Tsuda et al. | 228/179 X |
| 5,054,194 | 10/1991 | Pollock | 228/4.5 X |
| 5,229,918 | 7/1993 | Bosca et al. | 361/421 X |

FOREIGN PATENT DOCUMENTS 200736  9/1987  Japan ................................. 228/4.5

OTHER PUBLICATIONS

A Novel Multichip Module Assembly Approach Using Gold Ball Flip-Chip Bonding; Goodman, Cathryn E. and Metroka, Michael P.; IEEE Transactions on Components, Hybrids, and Manufacturing Technology, vol. 15, No. 4, Aug. 1992.

Primary Examiner—Kenneth J. Ramsey
Attorney, Agent, or Firm—Hickman & Beyer

[57] ABSTRACT

Certain components of an integrated circuit package are disclosed herein including one or more dies, each of which has an array of die output/input bond pads, and die support means, for example a substrate or leadframe, which includes an array of electrically conductive leads. There is also disclosed herein a technique for wire bond connecting the bond pads of a particular die to either the bond pads of a second die or to the electrically conductive leads of the substrate or leadframe using a thermosonic or thermocompression ball bonding tool. In accordance with this technique, where at least one die is involved, connections are made to the bond pads of that die by means of stitch bonding in a way which does not damage the die.

9 Claims, 2 Drawing Sheets

METHOD OF AND ARRANGEMENT FOR BOND WIRE CONNECTING TOGETHER CERTAIN INTEGRATED CIRCUIT COMPONENTS The present invention relates generally to an integrated circuit package and other such electronic devices, and more particularly to a specific technique for wire bonding together certain components making up the integrated circuit package or other such devices.

A typical integrated circuit package includes a die having an array of die output/input bond pads and means for supporting the die, for example a substrate or leadframe, including an array of electrically conductive leads respectively connected to corresponding die bond pads by means of cooperating bonding wires. An example of such a package is illustrated in FIG. 1 and generally designated by the reference numeral 10. Integrated circuit package 10 is shown including a substrate 12 having on its top surface thereof an array of electrically conductive leads, one of which is indicated at 14. Substrate 12 supports a die 16 having an array of die output/input bond pads, one of which is indicated at 18. The electrically conductive lead 14 is shown connected with die bond pad 18 by means of an electrically conductive bonding wire 20.

In the particular example illustrated in FIG. 1, thermosonic or thermocompression ball bonding tool is used to first ball bond the free end of the wire 20 to pad 18, as indicated by the ball bond 22, and thereafter stitch bond the opposite end of the bonding wire to lead 14, as indicated by the stitch bond 24. The free end of a capillary 26 forming part of the overall ball bonding tool is shown completing the stitch bond at lead 14. It is conventional practice to make the first, ball bond at the pad on the die and the second, stitch bond at the lead on the substrate rather than the reverse. This is because, in most cases, conventional thermosonic or thermocompression wire bonding tools utilize capillaries that exceed the size of the bond pad which is typically 4 mils square. As a result, if the capillary 26 is used to make to make a second, stitch bond directly to die bond pad 18, as illustrated in FIG. 2, the capillary will, most likely, impact the passivation area and other features of the die immediately surrounding the pad, thereby possibly producing cracks, cratering and other damage. No such damage occurs when the capillary is used to connect wire 20 to pad 18, as illustrated in FIG. 1, since the capillary always remains apart from the surrounding area of the pad by the thickness of ball bond 22.

Even though it is clearly advantageous to wire bond lead 14 on substrate 12 to pad 18 on die 16 in the manner illustrated in FIG. 1 rather than the manner shown in FIG. 2, applicants nevertheless have good reasons to carry out the second, stitch bond at the die. For example, in the case of substrate 12, applicants have discovered instances where the substrate is adequately supported to allow the capillary to make a satisfactory ball bond at each of its electrically conductive leads but not a satisfactory stitch bond, thereby requiring that the second, stitch bond be made at the die pad. As another example, where it is necessary to make a die-to-die connection, the only way this can be done using the same thermosonic or thermocompression ball bonding tool is to make the second, stitch bonds at the pads of one of the dies. Still another example where applicants have found it necessary to perform the second, stitch bond to the die pads is where the die is designed to require fine pitch bonding.

It is, of course, possible to use existing ultrasonic wedge bonders to connect to small bond pads of a die. However, this type of equipment is not always readily available in the manufacturing plant and the throughput is too slow. As will be seen hereinafter, applicants have discovered a way to use a thermosonic or thermocompression ball bonding tool, without modification, in order to make the necessary second, stitch bond at the die without damaging the latter. Specifically, as an initial step in the wire bonding process, an electrically conductive bump is formed on the die bond pad or pads in question. Thereafter, using a thermosonic or thermocompression ball bonding tool, an electrically conductive bonding wire is connected with each die bond pad having an electrically conductive bump and its associated lead (or other such external component) by first ball bonding the free end of each bonding wire to a lead (or other such external component) and thereafter stitch bonding an opposite end of the bonding wire to the electrically conductive bump on the associated die bond pad. This technique is equally applicable where die-to-die connections are required and, indeed, where a second, stitch bond must be made to any electronic component which is too small to make a conventional stitch bond safely. It also facilitates the performance of fine stitch bonding, as will be seen. In an actual working embodiment of the present invention, each of the initial electrically conductive bumps is formed on its die bond pad by first ball bonding the free end of an electrically conductive bonding wire onto the die bond pad using the ball bonding tool just mentioned and thereafter, again using that tool, stitch bonding the same wire to its ball bonded end at a point on the wire immediately adjacent the ball bonded end such that the ball bond and the stitch bond together form the electrically conductive bump.

The present technique and the ultimately formed integrated circuit package will be described in more detail hereinafter in conjunction with the drawings, wherein.

Figure 1:
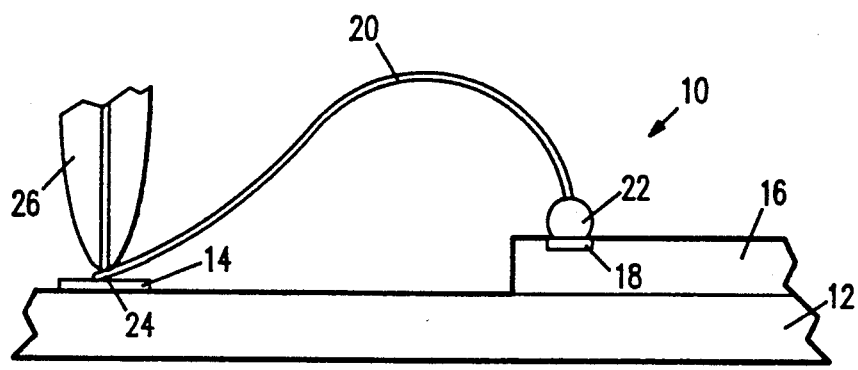
FIG. 1 is a diagrammatic illustration of part of an integrated circuit package including a die supported on a substrate and specifically depicts a prior art thermosonic or thermocompression wire bonding technique for electrically connecting a die bond pad forming part of the die with an electrically conductive lead forming part of the substrate.
Figure 2:
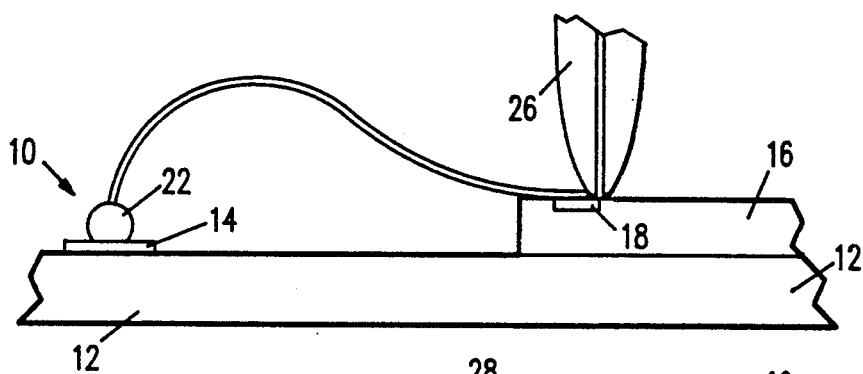
FIG. 2 is a view similar to FIG. 1 but specifically illustrating a second, unacceptable way to electrically connect the die bond pad with the electrically conductive lead.
Figure 3:
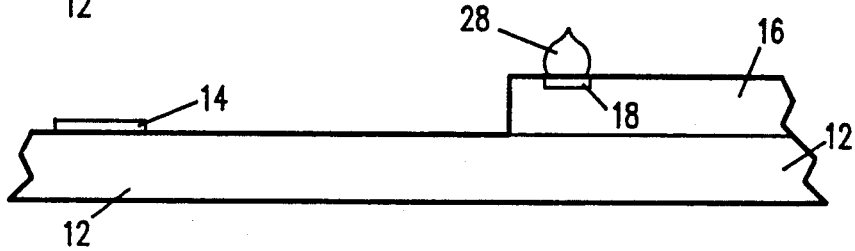
Figure 4:
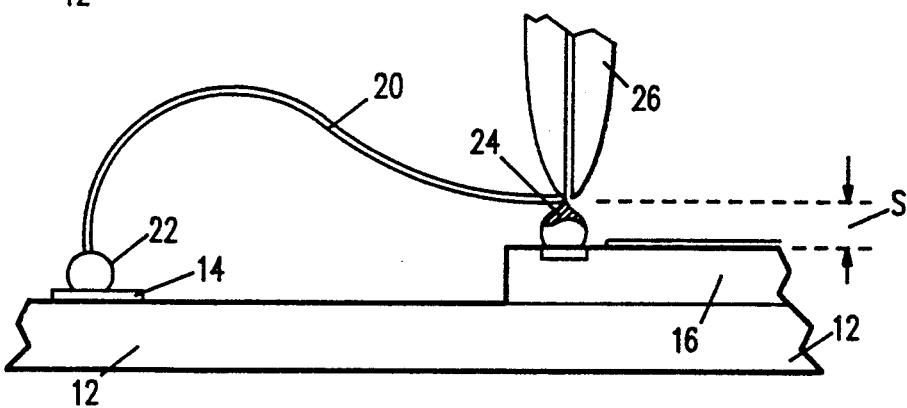
Figure 5:
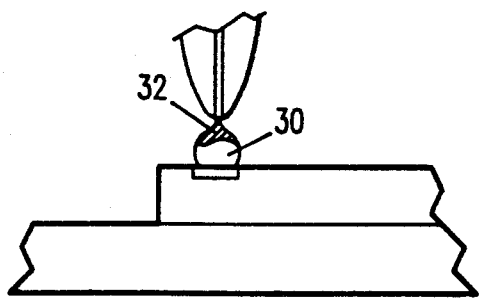
Figure 6:
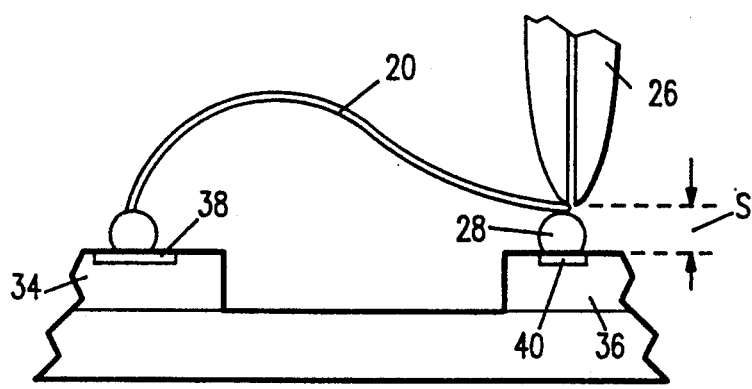
Figure 7:
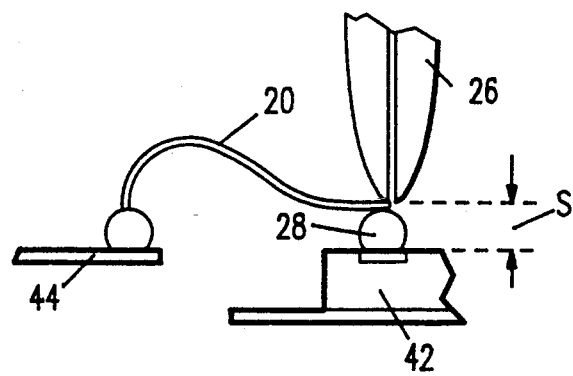
Figure 8:
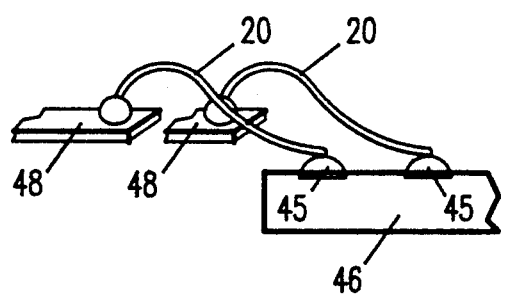
Figure 9:
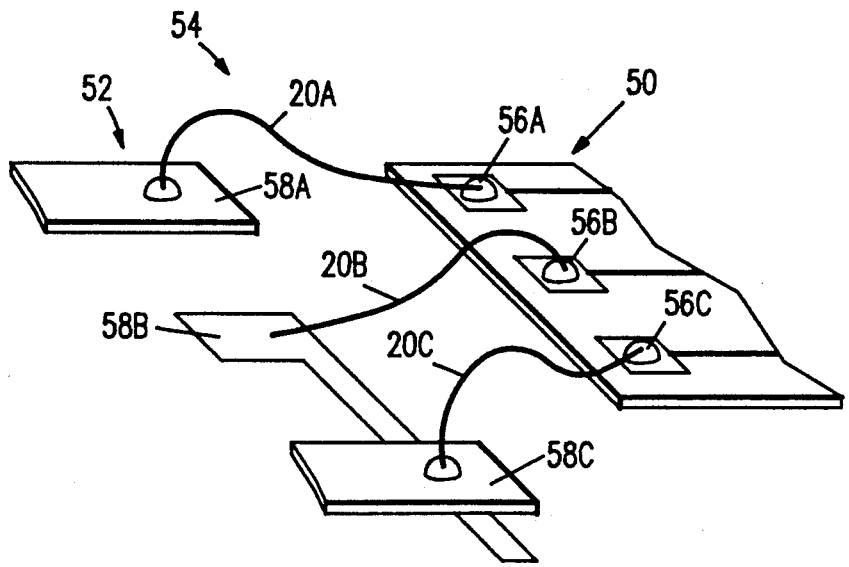

FIGS. 3 and 4 diagrammatically depict the same part of the integrated circuit package shown in FIGS. 1 and 2 but specifically illustrate a novel thermosonic or thermocompression wire bonding technique for electrically connecting together a die bond pad and the electrically conductive lead;

FIG. 5 diagrammatically depicts one of the steps in the preferred way of carrying out the wire bonding technique associated with FIGS. 3 and 4;

FIG. 6 diagrammatically illustrates the way in which the wire bonding technique depicted in FIGS. 3 and 4 is used to make die-to-die connections;

FIG. 7 diagrammatically illustrates the way in which the bonding technique depicted in FIGS. 3 and 4 is used to make die-to-leadframe connections; and FIGS. 8 and 9 diagrammatically illustrate two ways in which certain components, (including one having fine pitched leads, pads or other such electrically conductive contacts) are electrically connected together by means of fine pitch bonding.

Turning now to the drawings, attention is immediately directed to FIGS. 3 and 4, inasmuch as FIGS. 1 and 2 were discussed previously. Like FIGS. 1 and 2, FIGS. 3 and 4 diagrammatically illustrate part of an integrated circuit package including specifically substrate 12, its array of electrically conductive leads including lead 14, die 16, and its array of die output/input bond pads including die bond pad 18. FIG. 3 specifically illustrates an initial step in wire bonding electrically conductive lead 14 to die bond pad 18 in accordance with the present invention. As seen in this latter figure, an electrically conductive ball or bump 28 is formed on pad 18, preferably in the manner to be described hereinafter in conjunction with FIG. 5. Thereafter, using the previously recited ball bonding tool including specifically capillary 26, electrically conductive bonding wire 20 is connected with electrically conductive lead 14 and die bond pad 18 by first ball bonding the free end of the bonding wire to the lead, as indicated at 22 in FIG. 4, and thereafter stitch bonding an opposite end of the bonding wire to electrically conductive bump 28, as indicated at 24. Where a number of electrically conductive leads are to be wire bonded to a corresponding number of die pads, the bumps 28 can be formed on all of the appropriate die pads before any connection is actually made between the leads and die pads, or the actual connection between any given lead and its associated die pad can be made before the formation of the next bump, or a combination of both of these approaches can be carried out in accordance with the present invention.

The only difference between the wire bonding technique described immediately above in conjunction with FIGS. 3 and 4, and the technique disclosed previously in conjunction with FIG. 2 resides in the initial formation of electrically conductive bump 28 and the fact that bonding wire 20 is stitch bonded to the bump rather than directly to the die bond pad. As a result, during that time that the capillary is making the stitch bond on bump 28, the latter serves as a spacer between the surrounding region of the die and capillary 26. Thus, the capillary gets no closer to the die surface surrounding die pad 18 that the distance S which is sufficient to keep the capillary from damaging the die in the manner described above in conjunction with FIG. 2.

While electrically conductive bump 28 may be formed on its associated die bond pad 18 in any suitable manner, in a preferred embodiment, the same ball bonding tool used to connect bonding wire 20 to lead 14 and pad 18 is used to form the electrically conductive bump. Specifically, as illustrated in FIG. 5, electrically conductive bump 28 is formed on its die bond pad by first ball bonding the free end of an electrically conductive wire onto the die bond pad, as indicated at 30, and thereafter stitch bonding the same wire to its ball bonded end at a point on the wire immediately adjacent the ball bonded end, as indicated at 32, such that the ball bond and stitch bond together form the electrically conductive bump. An individual with ordinary skill in operating the ball bonding tool can readily carry out this procedure.

FIG. 6 diagrammatically illustrates the way in which the wire bonding technique just described can be used to make die-to-die connections. As seen in this figure, first and second dies 34 and 36, respectively, are supported on suitable means, for example a substrate 38. Like previously described die 16, die 34 includes an array of die output/input bond pads, one of which is shown at 38, and die 36 includes a similar array of bond pads, one of which is shown at 40. If the die bond pad 38 illustrated in FIG. 6 is to be wire bonded to the die bond pad 40 using the previously described ball bonding tool, the bonding wire utilized to make this connection can only be ball bonded to one of the pads. Therefore, a bonding wire must be stitch bonded to the other pad. This is accomplished in the same manner described immediately above. Specifically, as illustrated in FIG. 6, using capillary 26, a bump 28 is initially formed on pad 40 and thereafter, using the same tool, the bonding wire 20 is first ball bonded one end to pad 38 and then stitch bonded at the other end to bump 28. The same spacing S between the capillary and die 36 is preserved, thereby protecting the die against capillary damage.

The same procedure can be carried out for wire bonding the die bond pad of a die 42 with the lead 44 forming part of an overall leadframe, as illustrated in FIG. 7. As seen there, an electrically conductive bump 28 is formed on the pad of the die 42 and thereafter the wire 20 is first ball bonded at one end to the lead 44 and then stitch bonded at its opposite end to the bump 28, again preserving the spacing S between capillary 26 and the die itself.

FIG. 8 diagrammatically illustrates the way in which the present invention is used to connect fine pitched die bond pads 45 on a die 46 with leads 48 spaced further apart than the pads. These connections are made using bonding wires 20 in the same manner described above in conjunction with FIGS. 4, 6 and 7. It should be noted that, in all of these cases, particularly in the case of FIG. 8, each bonding wire moves upward and downward rather quickly near the ball bond and then levels off for a relatively greater length as it approaches its stitch bond, thereby placing what will be referred to as a top loop much closer to the ball bond than the stitch bond. Using the present bonding technique described above in conjunction with FIGS. 4, 6 and 7, the second stitch bonds in the embodiment of FIG. 8 can be made at the fine pitch die pads 45, resulting in top loops that are closer to the leads 48 than the die pads. Therefore, since leads 48 are placed further from one another than the fine pitched die pads 45, the top loops of the bonding wires will not interfere with the capillary as successive bonding wires are bonded in place. That is, the spacings between adjacent top loops are sufficiently large to accommodate the capillary. On the other hand, the spacing between adjacent fine pitched die pads would not be sufficiently large to accommodate a capillary if the top loops were positioned adjacent the die pads rather than the leads. Thus, by taking advantage of the present invention, a thermosonic or thermocompression ball bonding tool can be used to carry out fine pitch bonding.

Another example of fine pitch bonding utilizing a thermosonic or thermocompression ball bonding process is illustrated in FIG. 9. This figure depicts first and second components 50 and 52, respectively, of an overall electronic device 54. The first component 50 includes an array of adjacent electrically conductive contact points 56A, 56B and 56C. The second component 52 includes a corresponding array of electrically conductive contact points 58A, 58B and 58C. In the particular embodiment illustrated, component 50 is a die and the contact points 56 are die bond pads while component 52 is a member including electrically conductive leads 58. In accordance with the present invention, bonding wires 20A, 20B and 20C are bonded to corresponding pairs of contacts 56A-C and 58A-C. Note, in particular, that the bonding wire 20A is ball bonded to contact 58A and stitch bonded to contact 56A; the next adjacent bonding wire 20B is ball bonded to contact 56B and stitch bonded to contact 58B; and the bonding wire 20C is ball bonded to contact 58C and stitch bonded to contact 56C. As a result, the top loop of bonding wire 20A is disposed adjacent component 52, the top loop of the next successive bonding wire is disposed adjacent the component 50, and so on such that the top loops of successive bonding wires alternate in closeness to the components 50 and 52. This has the advantage that no two adjacent bonding wires have their top loops adjacent to one another. As a result, the spacing between the aligned top loops of either odd numbered or even numbered bonding wires more readily accommodates a capillary and it reduces the chances of shorting between bonding wires. In the case of the particular embodiment illustrated in FIG. 9 where component 50 is a die, the stitch bonds made at pads 56A and 56C could and preferably would be made on electrically conductive bumps 28, as described previously. Where this is not required, for example where component 50 is not a die and will not be damaged by a conventional stitch bond, the bumps 28 are not necessary.

The wire bonding technique described above and illustrated in association with FIGS. 2-9 has been described in conjunction with an integrated circuit package including one or more die and a substrate or leadframe. It is to be understood that this bonding technique is not limited to such applications but may be provided in any case where it is necessary to provide a second, stitch bond to the die bond pad of a die. Indeed, even cases other than a die, it may be necessary to provide a second, stitch bond to a surface that, like the die, could be damaged by the capillary. The present technique is equally applicable in that situation. Moreover, the technique contemplates connecting pads to pads, pads to leads, leads to leads, and electrically conductive contacts to contacts generally.

We claim:

1. In the manufacture of an electronic device including an electrically conductive lead forming part of a substrate or leadframe, and a die having a die bond pad, a method of electrically connecting said electrically conducting lead to said die bond pad, comprising the steps of:
   (a) forming an electrically conductive bump on said die bond pad; and
   (b) using a thermosonic or thermocompression ball bonding tool, connecting an electrically conductive bonding wire between said electrically conductive lead and said die bond pad by first ball bonding the free end of the bonding wire to said electrically conductive lead and thereafter stitch bonding an opposite end of the bonding wire to the electrically conductive bump on the die pad.

2. In the manufacture of an integrated circuit package including a die which includes an array of die output/input bond pads and which is supported by means including an array of electrically conductive leads, a method of electrically connecting each of said leads with a corresponding one of said die bond pads, comprising the steps of:
   (a) forming an electrically conductive bump on each of said corresponding die bond pads; and
   (b) using a thermosonic or thermocompression ball bonding tool, connecting an electrically conductive bonding wire to each lead and its corresponding die bond pad by first ball bonding the free end of each bonding wire to its associated lead and thereafter stitch bonding an opposite end of the bonding wire to the electrically conductive bump on the corresponding die bond pad.

3. A method according to claim 2 wherein each of said electrically conductive bumps is formed on its die bond pad by first ball bonding the free end of an electrically conductive bonding wire onto the die bond pad using said ball bonding tool and thereafter, using the same tool, stitch bonding the same wire to its ball bonded end at a point on said wire immediately adjacent said ball bonded end such that the ball bond and the stitch bond together form said electrically conductive bump.

4. A method according to claim 2 wherein the pitch between said die bond pads is finer than the pitch between said leads.

5. A method according to claim 2 wherein said means supporting said die is a substrate with said leads printed on one surface thereof.

6. A method according to claim 2 wherein said means supporting said die is a leadframe.

7. In the manufacture of an integrated circuit package including a first die and a second die, each of which includes an array of die output/input bond pads, a method of electrically connecting each of the bond pads of said first die with a corresponding one of the die bond pads of the second die, comprising the steps of:
   (a) forming an electrically conductive bump on each of the bond pads of the second die wherein each bump is formed by ball bonding an electrically conductive bump wire onto an associated die bond pad using a thermosonic or thermocompression ball bonding tool and thereafter, using the same tool, stitch bonding the bump wire to its ball bonded end at a point on said bump wire immediately adjacent said ball bonded end such that the ball bond and the stitch bond together form said electrically conductive bump; and
   (b) using the bonding tool, connecting an electrically conductive bonding wire to each die bond pad of the first die and its corresponding die bond pad of the second die by first ball bonding the free end of each bonding wire to its associated die bond pad of the first die and thereafter stitch bonding an opposite end of the bonding wire to the electrically conductive bump on the corresponding die bond pad of the second die.

8. In the manufacture of an electronic device including first and second components having corresponding arrays of adjacent electrically conductive contact points, a method of electrically connecting together corresponding pairs of said contact points, said method comprising the steps of:
   (a) forming an electrically conductive bump on each contact point in said array of electrically conductive contact points in said second component; and
   (b) providing a thermosonic or thermocompression ball bonding tool;

(c) using said tool, connecting a first electrically conductive bonding wire to a first corresponding pair of said contact points by first ball bonding the free end of said bonding wire to the contact point of said first pair on said first component and thereafter stitch bonding an opposite end of the bonding wire with the electrically conductive bump formed on the contact point of said first pair on said second component;

(d) using said tool, connecting a second electrically conductive bonding wire to a second corresponding pair of contact points immediately adjacent said first pair of contact points by first ball bonding the free end of said second bonding wire to the electrically conductive bump formed on the contact point of said second pair on said second component and thereafter stitch bonding an opposite end of the second bonding wire with the contact point of said second pair on said first component; and (e) repeating steps (c) and (d) for any successive pairs of contact points.

9. In the manufacture of an electronic device including first and second components, a method of electrically connecting said components together, comprising the steps of:

(a) forming an electrically conductive bump on a first component by ball bonding an electrically conductive wire onto the first component using a thermosonic or thermocompression ball bonding tool and thereafter, using the same tool, stitch bonding the wire to its ball bonded end at a point on said wire immediately adjacent said ball bonded end such that the ball bond and the stitch bond together form said electrically conductive bump; and (b) using said bonding tool to connect an electrically conductive bonding wire between said first and second components by first ball bonding a free end of the bonding wire to the second component and thereafter stitch bonding a second end of the bonding wire to the electrically conductive bump.

* * * * *